(12) United States Patent
Fernando et al.

(10) Patent No.: US 9,413,319 B2
(45) Date of Patent: Aug. 9, 2016

(54) GAIN CALIBRATION

(71) Applicant: Analog Devices, Inc., Norwood, MA (US)

(72) Inventors: Lalinda D. Fernando, Westford, MA (US); Michael Coln, Wilmington, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/222,877

(22) Filed: Mar. 24, 2014

(65) Prior Publication Data
US 2015/0270818 A1 Sep. 24, 2015

(51) Int. Cl.
*H03G 3/30* (2006.01)
*H03M 1/10* (2006.01)
*H03M 1/12* (2006.01)

(52) U.S. Cl.
CPC ............ *H03G 3/30* (2013.01); *H03G 3/3052* (2013.01); *H03M 1/1028* (2013.01); *H03M 1/12* (2013.01)

(58) Field of Classification Search
CPC ..................................................... H03G 3/30
USPC ............................................. 330/279, 278, 9
See application file for complete search history.

(56) References Cited

U.S. PATENT DOCUMENTS

| | | | | |
|---|---|---|---|---|
| 5,764,541 A * | 6/1998 | Hermann et al. | | 702/98 |
| 5,901,346 A * | 5/1999 | Stengel et al. | | 455/126 |
| 6,304,140 B1 * | 10/2001 | Thron et al. | | 330/149 |
| 6,420,934 B1 * | 7/2002 | Butler et al. | | 330/279 |
| 6,677,823 B2 * | 1/2004 | Terosky et al. | | 330/289 |
| 7,286,613 B2 * | 10/2007 | Baron et al. | | 375/296 |
| 7,515,880 B2 * | 4/2009 | Rozenblit et al. | | 455/73 |
| 7,541,952 B1 * | 6/2009 | Sankaran et al. | | 341/118 |
| 7,590,190 B2 * | 9/2009 | Luke et al. | | 375/297 |
| 7,595,694 B2 * | 9/2009 | Takahashi et al. | | 330/285 |
| 7,724,090 B2 * | 5/2010 | Lin et al. | | 330/279 |
| 8,228,121 B2 * | 7/2012 | Benhamouda et al. | | 330/279 |
| 8,742,844 B2 * | 6/2014 | Kousai | | 330/136 |
| 9,019,011 B2 * | 4/2015 | Hietala et al. | | 330/131 |
| 2011/0001541 A1 * | 1/2011 | Nagayama | | 327/361 |
| 2012/0306572 A1 * | 12/2012 | Hietala et al. | | 330/131 |
| 2013/0342270 A1 * | 12/2013 | Baxter et al. | | 330/127 |
| 2014/0133526 A1 * | 5/2014 | Camuffo et al. | | 375/219 |

* cited by examiner

*Primary Examiner* — Henry Choe
(74) *Attorney, Agent, or Firm* — Knobbe, Martens, Olson & Bear, LLP (57) ABSTRACT

Apparatus and methods calibrate one or more gain ranges for errors. A system can identify offset error and amplification error that occurs when the system transitions from amplifying an input signal by a first gain factor to amplifying the input signal by a second gain factor. To identify the amplification error, the system can compare the slope of the data signal in a source or reference gain range with the slope of the data signal in the destination gain range. To identify the offset error, the system can compare the amplitude of the data signal in a destination gain range with an expected value in the destination gain range.

22 Claims, 6 Drawing Sheets

GAIN CALIBRATION

BACKGROUND

1. Field

Embodiments of the disclosure relate to electronics, and more particularly, in one or more embodiments, to calibrating the gain in data acquisition systems.

2. Description of the Related Technology

In data acquisition systems that employ automatic-gain control, as the amount of gain necessary to maintain a minimum level of accuracy varies with the signal, the elements used to provide the gain can also change. This can result in each active gain range acquiring a unique state. Two state variables that contribute to the uniqueness of the state are offset error and amplification error. As a consequence, normalized time domain signals can experience discontinuities at the gain transition locations. These discontinuities typically result in system non-linearity, causing distortion.

The typical method of avoiding such discontinuities is to perform a manual gain calibration during manufacturing. One time manual factory calibration has the inherent disadvantage of being unable to easily adapt the system to sustain the desired level of parametric accuracy over varying operating conditions such as temperature, supply voltage, and component aging. Also, manual calibration of all gain ranges typically consumes a substantial amount of time on the tester during manufacturing. Longer test times in turn contribute to higher manufacturing costs.

SUMMARY

An electrical circuit or apparatus is described that can reduce the amount of manual gain calibration for a data acquisition system, as well as continue to adapt the transfer function of the system over time to maintain accuracy over the operational lifetime of the system, thereby increasing robustness.

In some embodiments, an electronically-implemented method of calibrating a data acquisition system is provided. The method includes determining whether an amplitude of a data signal is within a first gain range, amplifying an input signal by a first gain amount based at least in part on a determination that the amplitude of the data signal is within the first gain range, determining whether the amplitude of the data signal enters a second gain range, amplifying the input signal by a second gain amount based at least in part on determining the amplitude of the data signal enters the second amplification range and at least one of an amplification calibration value or an offset calibration value, adjusting the amplification calibration value based at least on a detected amplification error of the data signal, and adjusting the offset calibration values based at least on a detected offset error of the data signal. In some embodiments, the first amplification range and the second are distinct.

In certain embodiments, an electronically-implemented method for calibrating a data acquisition system is provided. The method includes determining that a data signal satisfies a gain range threshold, amplifying an input signal by a gain amount based at least in part on one or more amplification calibration values, one or more offset calibration values, and on determining the data signal satisfies the gain range threshold, adjusting the one or more amplification calibration values based at least on a determined amplification error of the data signal, and adjusting the one or more offset calibration values based at least on a determined offset error of the data signal.

In some embodiments, the amplification error is determined by determining a first slope of the data signal, wherein the first slope is based at least in part on the amplitude of the data signal at a time prior to the data signal satisfying the gain range threshold, determining a second slope of the amplitude of the data signal, wherein the second slope is based at least in part on the amplitude of the data signal at a time following the data signal satisfying the gain range threshold, and determining the amplification error based at least in part on a difference between the first slope and the second slope.

In certain embodiments, the one or more amplification calibration values are based at least in part on one or more previously determined amplification errors. In some embodiments, the one or more amplification calibration values are based at least in part on an average of the one or more previously determined amplification errors. In certain embodiments, the one or more previously determined amplification errors are weighted based at least in part on an order in which the one or more previously determined amplification errors were determined.

In some embodiments, determining the first slope comprises determining an amount of time that has elapsed between the amplitude of the data signal satisfying a first slope threshold and the amplitude of the data signal satisfying a second slope threshold, and wherein determining the second slope comprises determining an amount of time that has elapsed between the amplitude of the data signal satisfying a third slope threshold and the amplitude of the data signal satisfying a fifth slope threshold. In certain embodiments, determining the first slope comprises determining a change in amplitude during a predetermined time period that is prior to the data signal satisfying the gain range threshold and determining the second slope comprises determining a change in amplitude during the predetermined time period following the data signal satisfying the gain range threshold.

In some embodiments, the offset error is determined by determining a first amplitude measurement of the data signal at a first time, wherein the first time is prior to the signal satisfying the gain range threshold, determining a second amplitude measurement of the data signal at a second time, wherein the second is after the data signal satisfying the gain range threshold, determining an expected value of the data signal at the second time based at least in part on the first amplitude measurement, and determining the offset error based at least in part on a difference between the second amplitude measurement and the expected value. In certain embodiments, the one or more offset calibration values are based at least in part on one or more previously determined offset errors. In some embodiments, the one or more offset calibration values comprise an average of one or more previously determined offset errors. In certain embodiments, the one or more previously determined offset errors are weighted based at least in part on an order in which the one or more previously determined offset errors were determined.

In some embodiments, a system is provided that includes a gain circuit configured to amplify an input signal by a first gain factor based at least in part on a control signal received from a gain controller, and a gain controller. The gain controller, in certain embodiments can be configured to cause the gain circuit to amplify the input signal by a second gain factor based at least in part on a determination that a data signal corresponding to the input signal satisfies a gain range threshold of a gain range, cause at least one of the gain circuit and a digital gain adjuster to adjust the input signal based at least in part on a calibration value, determine at least one of an offset error for the gain range and an amplification error for the gain range, and adjust the calibration value based at least in part on the at least one of the determined offset error and the determined amplification error. In some embodiments, the gain controller is further configured to determine the offset error for the gain range and the amplification error for the gain range, and adjust the calibration value based at least in part on the determined offset error and the determined amplification error. In certain embodiments, to determine the amplification error, the gain controller is configured to determine a first slope of the data signal, wherein the first slope is based at least in part on an amplitude of the data signal prior to the data signal satisfying the gain range threshold, determine a second slope of the data signal, wherein the second slope is based at least in part on the amplitude of the data signal following the data signal satisfying the gain range threshold, and determine the amplification error based at least in part on a difference between the first slope and the second slope.

In some embodiments, the calibration value is based at least in part on one or more previously determined offset errors. In certain embodiments, the one or more previously determined offset errors are weighted based at least in part on an order in which the gain controller determined the one or more previously offset errors. In some embodiments, to determine the offset error, the gain controller is configured to determine a first amplitude measurement of the data signal, wherein the first amplitude measurement is based at least in part on an amplitude of the data signal prior to the data signal satisfying the gain range threshold, determine a second amplitude measurement of the data signal, wherein the second amplitude measurement is based at least in part on the amplitude of the data signal following the data signal satisfying the gain range threshold, determine an expected value of the data signal based at least in part on the first amplitude measurement, and determine an offset calibration value based at least on a difference between the second amplitude measurement and the expected value. In certain embodiments, the calibration value is based at least in part on one or more previously determined offset errors.

DETAILED DESCRIPTION

The following detailed description of certain embodiments presents various descriptions of specific embodiments of the disclosure. However, the other embodiments of the disclosure can be implemented in a multitude of different ways as defined and covered by the claims. In this description, reference is made to the drawings where like reference numerals may indicate similar elements.

In data acquisition systems, it is common to use different gain settings depending on the amplitude of an input signal and/or processed data signal. The input signal can be a signal at the input of the system, and the processed data signal (also referred to as a data signal) can correspond to the input signal after it has been processed (e.g., amplified, attenuated, digitized, filtered, adjusted, and/or normalized, etc.). In some cases, the input signal can already have a gain associated with it (e.g., have previously been amplified by another system, component, etc. and/or the system can already be configured to amplify the input signal by a certain amount, etc.), and in other cases it may not.

As an example, and not to be construed as limiting, if the processed data signal is relatively small, the system may use a gain factor of four to increase the amplitude of the input signal (or further increase the amplitude of the input signal in the event that the input signal already has a gain associated with it). If the data signal satisfies a first gain range threshold, the data acquisition system can decrease the gain factor to two, and if the data signal satisfies a second gain range threshold, the data acquisition system can decrease the gain factor to one (or unity), or attenuate the signal. However, as mentioned previously, when the system transitions between different gain factors, error can be introduced. For example, gain error (also referred to as amplification error) and offset error can be introduced. The errors can result in discontinuities in the data signal and distortion.

To address this issue, a data acquisition system can include a calibration controller that is configured to identify and correct the introduced errors, such as the amplification error and the offset error. In some embodiments, to identify the offset error, the calibration controller can compare the amplitude of a normalized data signal (e.g., an input signal that has at least been normalized) prior to a gain change from a first gain factor to a second gain factor (e.g., when the amplitude of a normalized data signal is within a first gain range) with the amplitude of the normalized data signal following the gain change to the second gain factor (e.g., when the amplitude of a normalized data signal is within a second gain range). After identification, the calibration controller can use the identified offset error to adjust an offset calibration value for future transitions to the second gain factor. In certain embodiments, the system can compare the data signal (without normalization) prior to a gain change with the data signal after the gain change.

In certain embodiments, to identify the amplification error, the calibration controller can compare the slope of a data signal prior to a gain change to the second gain factor (e.g., when the amplitude of a data signal is within the first gain range) with the slope of the data signal following the gain change to the second gain factor (e.g., when the amplitude of a data signal is within the second gain range). After identification, the calibration controller can use the amplification error to adjust an amplification calibration value for future transitions to the second gain factor. In some embodiments, the calibration controller can use the identified offset and/or amplification errors to adjust a calibration value for the second gain factor. The calibration process can advantageously be performed in the background without incurring downtime for the data acquisition system.

Figure 1:
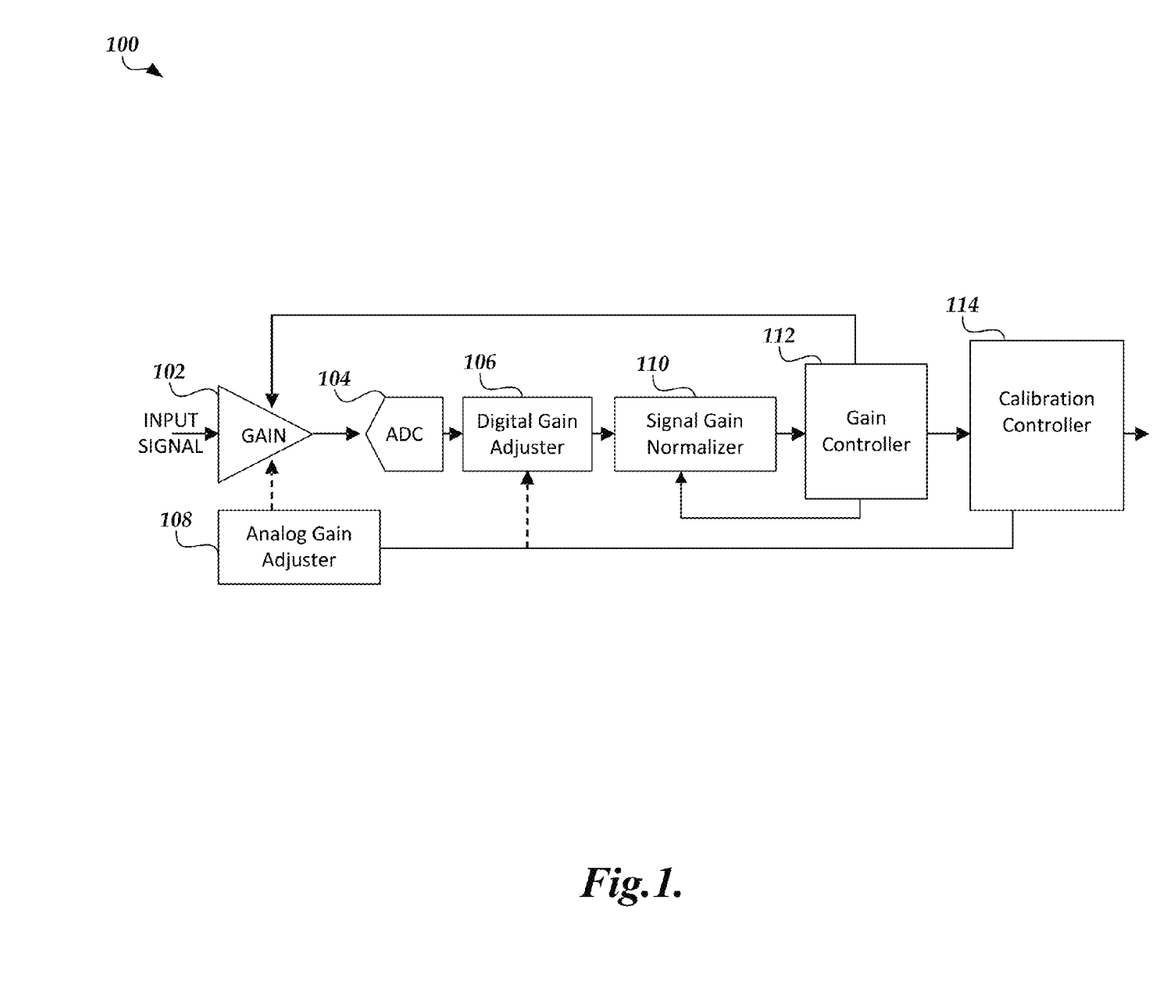
FIG. 1 is a block diagram illustrative of an embodiment of a system for calibrating gain.

FIG. 1 is a block diagram illustrative of an embodiment of a system 100 including a calibration controller configured to calibrate amplification and offset error in the system. In the illustrated embodiment of FIG. 1, the system 100 includes a gain circuit 102, an analog to digital converter (ADC) 104 to convert the analog signal output of the gain circuit 102 to a digital data signal, a digital gain adjuster 106, an analog gain adjuster 108, a signal gain normalizer 110, a gain controller 112, and a calibration controller 114.

The gain circuit 102 can include one or more amplifiers/attenuators (e.g., op-amps, etc.) and can be used to amplify an input signal based at least in part on a control signal received from the gain controller 112. In some embodiments, the input signal is an analog signal. The gain controller 112 can cause the gain circuit 102 to adjust the gain of the input signal based at least in part on a data signal. In certain embodiments, the data signal is a normalized digital data signal. In some embodiments, if the amplitude of the data signal satisfies one or more gain range thresholds, the gain controller 112 can cause the gain circuit 102 to change the amount by which the input signal is amplified (e.g., the gain factor). For example, if the data signal does not satisfy a first gain range threshold, the gain circuit 102 can amplify the input signal by a first gain factor (e.g., four). If the data signal satisfies the first gain range threshold, but does not satisfy a second gain range threshold, the gain circuit 102 can amplify the input signal by a second gain factor (e.g., two). If the data signal satisfies the second gain range threshold, the gain circuit 102 can amplify the input signal by a third gain factor (e.g., one, unity gain, ½, ¼, etc.). It will be understood that the input signal can be amplified by any gain factor, as desired, and that the system can include fewer or more gain ranges, gain range thresholds and/or gain factors as desired. In some embodiments, a different gain factor corresponds to each gain range.

The digital gain adjuster 106 and the analog gain adjuster 108 can be used to adjust the data signal (or its gain) in the analog and/or digital domain based at least in part on a control signal received from the calibration controller 114. For example, the digital gain adjuster 106 can be used to adjust the digital data signal (or its gain) that is output by the ADC 104, and the analog gain adjuster 108 can be used to adjust the analog data signal or the gain of the analog data signal in the gain circuit 102. In some embodiments, the system 100 can use the digital gain adjuster and/or the analog gain adjuster to compensate for the offset and amplification errors identified by the calibration controller 114.

In certain embodiments, the digital gain adjuster 106 can provide a signal to counteract the amplification and offset error identified by the calibration controller 114, as will be discussed in greater detail below. For example, in some embodiments, the digital gain adjuster 106 can use an adder to compensate for identified offset error and a multiplier to compensate for identified amplification error in the digital data signal, etc. However, it will be understood that the digital gain adjuster can adjust the gain of the analog data signal and/or the digital data signal in a variety of ways to compensate for offset and/or amplification errors.

In certain embodiments, the analog gain adjuster 108 can provide a signal to counteract the amplification and offset error identified by the calibration controller 114, as will be discussed in greater detail below. For example, in some embodiments, the analog gain adjuster 108 can provide a voltage to (or remove a voltage from) the gain circuit 102 to counteract an offset error. In certain embodiments, the analog gain adjuster 108 can adjust a variable resistor (e.g., a transistor) in a feedback loop to counteract an amplification error. However, it will be understood that the analog gain adjuster can adjust the gain of the analog data signal and/or the analog data signal in a variety of ways to compensate for offset and/or amplification errors. For example, in some embodiments, the analog gain adjuster 108 can amplify/attenuate the data signal prior to, or after, the gain circuit 102 amplifies/attenuates the data signal.

The signal gain normalizer 110 can be used to normalize the data signal. In some embodiments, the signal gain normalizer 110 can be used as the inverse to the gain circuit 102. For example, if the gain circuit 102 amplifies the data signal by two, the signal gain normalizer 110 can attenuate the signal by two, if the gain circuit 102 amplifies the data signal by four, the signal gain normalizer 110 can attenuate the signal by four, etc. In some cases, the signal gain normalizer 110 can be controlled by the gain controller 112. For example, the gain controller 112 can determine a gain factor for the signal gain normalizer 110 that can be an inverse of the gain factor of the gain circuit 102. Accordingly, in certain embodiments, the digital data signal received by the gain controller 112 can correspond to the analog data signal received at the gain circuit 102 (plus any error introduced by the gain circuit 102). As mentioned previously, the gain controller 112 can adjust the gain of the input signal in the gain circuit 102 based at least in part on the data signal.

As mentioned previously, error can be introduced into the data signal from the gain circuit 102. For example, the gain circuit 102 can introduce error with each gain factor. In some embodiments, error can be introduced when the gain circuit 102 transitions from amplifying the input signal by one gain factor to another gain factor (e.g., when the data signal changes gain ranges and/or satisfies a gain range threshold). In some embodiments, the error introduced by the system 100 can include amplification error and offset error, which will be described in greater detail below with reference to FIGS. 2A and 2B. The calibration controller 114 can be used to identify the errors in the various gain ranges of the system 100 and adjust one or more calibration values to compensate for the errors.

After the error for a particular gain range is identified, the calibration controller 114 can adjust calibration values in the analog gain adjuster 108 and/or the digital gain adjuster 106. When the data signal moves to the same gain range and the system 100 transitions to the same gain factor, the adjusted calibration values can be used that take into account the previously identified amplification and/or offset error in the particular gain range.

In some embodiments, the calibration controller 114 incrementally compensates for the error. For example, the calibration controller 114 can use multiple iterations of identifying and adjusting the calibration values to account for the error. In some cases, the calibration controller can have a long time constant for correcting the error. In certain embodiments, the calibration controller 114 compensates for the entire error after a single iteration. In some embodiments, the calibration controller 114 takes into account the identified error over multiple iterations to determine the calibration values for a particular gain range. In certain embodiments, the error(s) are weighted based on their order. For example, in certain instances, the error(s) identified more recently in time are weighted more heavily than the error(s) identified less recently to determine and/or adjust the calibration value. In some embodiments, the identified errors over multiple iterations are averaged to determine and/or adjust the calibration value.

In some embodiments, the calibration controller performs the calibration for a particular gain range, when the data signal transitions to that particular gain range. Similarly, the calibration controller 114 can identify and compensate for the errors in all gain ranges. In some embodiments, the calibration controller 114 does not identify or compensate for the errors in one or more gain ranges. For example, in certain embodiments, one or more gain ranges can be calibrated during manufacturing and can be used as one or more reference gain ranges. Accordingly, in some embodiments, the calibration controller 114 does not identify or compensate for the errors in the one or more reference gain range. In certain embodiments, the system 100 uses the values and/or the slope of the data signal in the one or more reference gain ranges to determine the offset/amplification errors for other gain ranges, and calibrate other gain ranges.

It will be understood that fewer or more components can be used in the system 100. For example, in some embodiments, the signal gain normalizer 110 and calibration controller 114 can be omitted. In certain embodiments, the functions of the signal gain normalizer 110 and the calibration controller 114 can be performed by the gain controller 112. Furthermore, it will be understood that the order of the components can be changed as well. For example, in some embodiments, the gain controller 112 and the signal gain normalizer 110 can be switched, etc.

Figure 2A:
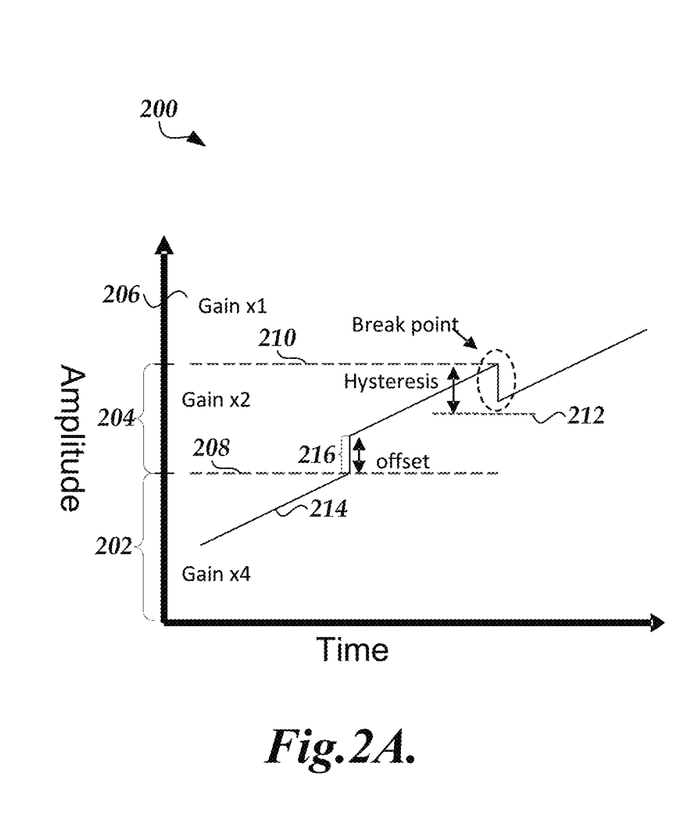
FIG. 2A is a graph illustrative of an embodiment of offset error in a system.

FIG. 2A is a graph illustrative of an embodiment of offset error in a system. Time is expressed along a horizontal axis. An amplitude of the data signal (e.g., the normalized data signal) is expressed along a vertical axis. In the illustrated embodiment of FIG. 2A, a graph 200 includes three gain ranges 202, 204, 206, two gain range thresholds 208, 210, and a hysteresis threshold 212. The graph 200 further includes a line 214 indicative of a data signal (or its corresponding input signal) as it satisfies the gain range thresholds 208, 210. In the illustrated embodiment, while the amplitude of the data signal (or its corresponding input signal) remains within the first gain range 202, the system 100 can amplify the input signal with a gain of four. Similarly, while the amplitude of the data signal remains within the second gain range 204 and the third gain range 206, the system 100 can amplify the input signal with a gain of two and one, respectively. Other gain amounts will be applicable and readily determined by one of ordinary skill in the art.

The line 214 further illustrates an example of offset error that can be introduced by the system when the system 100 transitions from amplifying the input signal by a first gain factor (e.g., four) in the first gain range 202 to amplifying the input signal by a second gain factor (e.g., two) in the second gain range 204.

In a system without any error, the amplitude of the data signal reflects the amplitude of the input signal and/or increases/decreases linearly, or approximately linearly, across and between the gain ranges 202, 204, 206. In the illustrated embodiment, the normalized data signal is linear while it is within in the first gain range 202. However, in the illustrated embodiment, when the system 100 transitions from amplifying the input signal by a gain of four to a gain of two (based at least in part on the amplitude of the normalized data signal satisfying the first gain range threshold 208 and/or entering the second gain range 204), the amplitude of the data signal increases by a step 216. The step 216 can also be referred to as an offset error 216.

In some embodiments, each gain range 202, 204, 206 can have a corresponding offset error, and the offset error for each gain range 202, 204, 206 can be different or the same. Furthermore, the offset error 216 can vary over time based at least in part on temperature, supply voltage, and/or component age. In some embodiments, the offset error for one gain range is manually calibrated at manufacturing. In such embodiments, the gain range with the calibrated offset error can be referred to as the reference gain range. In certain embodiments, the reference gain range is the gain range that corresponds to the largest gain factor (e.g., the first gain range 202 in the illustrated embodiment).

In some embodiments, the calibration controller 114 identifies the offset error based at least in part on a value of the data signal in the source gain range (e.g., the gain range that the data signal is leaving, or has left, or a reference gain range) or at the gain range threshold, and a value of the data signal in the destination gain range (e.g., the gain range that the data signal is entering, or has entered). For example, the calibration controller 114 can identify the offset error 216 based at least in part on the size of the step 216. In some embodiments, the calibration controller 114 compares the value of the data signal in the destination gain range with an expected value of the data signal in the destination gain range. The expected value can be determined based at least in part on a value of the data signal in the first gain range 202 and/or the reference gain range.

Once identified, the calibration controller 114 can use the offset error 216 to adjust the gain settings (e.g., adjust an offset calibration value or a calibration value) for the second gain range 204. Accordingly, the next time the system 100 amplifies the input signal by the gain factor (e.g., the amplitude of the normalized data signal enters the second gain range from either the first gain range 202 or the third gain range 206 and/or satisfies at least one of the gain range threshold 208 or hysteresis threshold 212), the gain circuit 102, the digital gain adjuster 106 and/or the analog gain adjuster 108 can compensate for the error based at least in part on the adjusted calibration value. For example, in certain embodiments, the digital gain adjuster can adjust the digital data signal and/or the analog gain adjuster 108 can adjust the gain at the gain circuit 102.

In some embodiments, the calibration controller 114 incrementally adjusts the calibration value. In certain embodiments, the entirety of the error is not corrected after a single iteration of the calibration controller. In some cases, the calibration controller can have a long time constant for correcting the error. In some embodiments, the calibration controller adjusts the calibration value to account for the entire error in a single iteration. As mentioned previously, each gain range 202, 204, 206 can have its own offset error, and the calibration controller can adjust a separate calibration value for each gain range 202, 204, 206 based at least in part on the offset error corresponding to the respective gain range. For example, as discussed previously, the calibration controller 114 and/or calibration value can cause the digital gain adjuster 106 to adjust the digital data signal and/or the analog gain adjuster 108 to adjust the gain of the gain circuit 102 (or the analog data signal or the input signal). Furthermore, as mentioned previously, hysteresis thresholds can be used when transitioning from a higher gain range (e.g., the third/second gain range 206, 204) to a lower gain range (e.g., the second/first gain range 204, 202).

The graph 200 further illustrates the transition that occurs when the amplitude of the data signal (e.g., normalized data signal) and/or input signal moves from the second gain range 204 to the third gain range 206. In the illustrated embodiment, the offset error (if any) of the third gain range 206 is less than the offset error 216. Accordingly, when the system transitions from amplifying the input signal by the second gain factor (e.g., two) to the third gain factor (e.g., one) (due to the amplitude of the normalized data signal transitioning from the second gain range 204 to the third gain range 206 and/or satisfying the second gain range threshold 210), the offset error 216 is replaced with the offset error of the third gain range 206. As illustrated, as the offset error of the third gain range 206 is less than the offset error 216, the amplitude of the normalized data signal falls below the second gain range threshold 210. However, to avoid transitioning back and forth between the third gain factor and the second gain factor, a hysteresis threshold 212 is used rather than the second gain range threshold 210 to determine when to transition from the third gain range 206 to the second gain range 204. Similarly, although not illustrated, a hysteresis threshold can be used to transition from the second gain range 204 to the first gain range 202.

Accordingly, in some embodiments, when transitioning from a higher gain range to a lower gain range, hysteresis thresholds can be used as the gain range thresholds to avoid a situation in which the system 100 frequently transitions between two gain factors because the normalized data signal is moving back and forth across a corresponding gain range threshold.

Figure 2B:
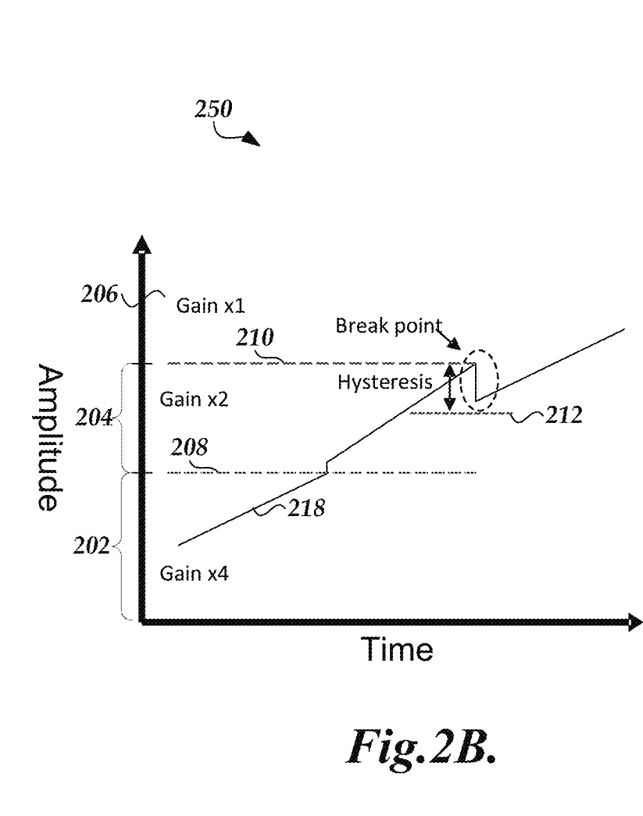
FIG. 2B is a graph illustrative of an embodiment of gain error in a system.

FIG. 2B is a graph 250 illustrative of an embodiment of amplification error in a system. In the illustrated embodiment of FIG. 2B, the graph 250 is illustrated with the three gain ranges 202, 204, 206, the two gain range thresholds 208, 210, and the hysteresis threshold 212, as described above with reference to graph 200 of FIG. 2A. However, in the illustrated embodiment of FIG. 2B, the graph 250 includes a line 218 indicative of a data signal, such as a normalized data signal, as it passes through the gain range thresholds 208, 210. As discussed previously with reference to the graph 200 of FIG. 2A, an input signal is amplified based at least in part on the location of the amplitude of the data signal within the gain ranges 202, 204, 206.

The line 218 further illustrates an embodiment of amplification error that is introduced by the system 100 when the system 100 transitions from amplifying the input signal by a first gain factor in the first gain range 202 to amplifying the input signal by the second gain factor in the second gain range 204.

In a system without any error, the slope of the amplitude of the data signal reflects the slope of the amplitude of the input signal and/or remains constant, or approximately constant, across and between the gain ranges 202, 204, 206. In the illustrated embodiment, the slope of the amplitude of the data signal is constant, or approximately constant, while it is within in the first gain range 202. However, when the system 100 transitions from amplifying the input signal by a first gain factor to amplifying the input signal by the second gain factor (e.g., when the amplitude of the normalized data signal satisfies the first gain range threshold 208 and/or enters the second gain range 204), the slope changes (e.g., increases or decreases).

The change in slope between the two gain ranges can also be referred to as an amplification error. In some embodiments, each gain range 202, 204, 206 can have an amplification error, and the amplification error for each gain range 202, 204, 206 can be different or the same. Furthermore, the amplification error for each gain range 202, 204, 206 can vary over time based at least in part on temperature, supply voltage, and/or component age. In some embodiments, the amplification error for one gain range is manually calibrated at manufacturing. In such embodiments, the gain range with the calibrated amplification error can be referred to as the reference gain range. In certain embodiments, the reference gain range is the gain range that corresponds to the largest gain factor (e.g., the first gain range 202 in the illustrated embodiment).

In some embodiments, the calibration controller 114 identifies the error by comparing the slope of the data signal in the source gain range (e.g., the gain range that the data signal is leaving, or has left, or the reference gain range) with the slope of the data signal in the destination gain range (e.g., the gain range that the data signal is entering, or has entered). For example, the calibration controller 114 can identify the amplification error based at least in part on the slope of the data signal within the second gain range 204 compared with slope of the data signal within the first gain range 202. In some embodiments, the calibration controller 114 compares the slope of the data signal in the destination gain range with the slope of the data signal in the reference gain range to determine the amplification error.

Once identified, the calibration controller 114 can use the amplification error to adjust the gain settings (e.g., an amplification calibration value and/or a calibration value) for the second gain range 204. Accordingly, the next time the system amplifies the input signal by the gain factor (e.g., due to the amplitude of the normalized data signal entering the second gain range from either the first gain range 202 or the third gain range 206 and/or satisfying at least one of the gain range threshold 208 and the hysteresis threshold 212), the gain circuit 102, the digital gain adjuster 106 and/or the analog gain adjuster 108 can adjust the gain of the input signal based at least in part on the adjusted calibration value.

In some embodiments, the calibration controller 114 incrementally adjusts the calibration value. In certain embodiments, the entirety of the error is not corrected after a single iteration of the calibration controller. In some cases, the calibration controller can have a long time constant for correcting the error. In some embodiments, the calibration controller adjusts the calibration value to account for the entire error in a single iteration. As mentioned previously, each gain range 202, 204, 206 can have its own amplification error, and the calibration controller can adjust a separate calibration value for each gain range 202, 204, 206 based at least in part on the amplification error corresponding to a particular gain range of the gain ranges 202, 204, 206. Furthermore, as mentioned previously, hysteresis thresholds can be used when transitioning from a higher gain range (e.g., the third/second gain range 206, 204) to a lower gain range (e.g., the second/first gain range 204, 202).

Figure 3:
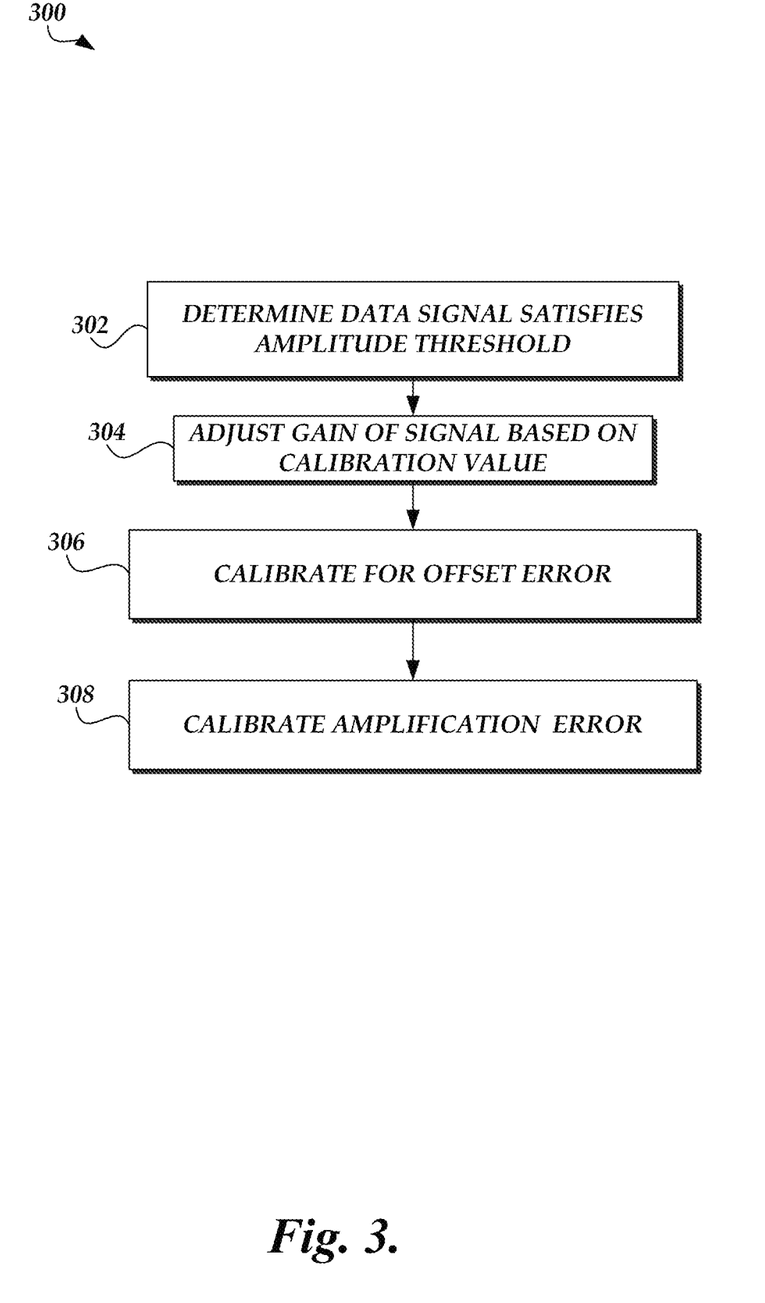
FIG. 3 is a flow diagram illustrative of an embodiment for calibrating offset error and gain error in a system.

FIG. 3 is a flow diagram illustrative of an embodiment of a routine 300 for calibrating a gain range in the system 100. One skilled in the relevant art will appreciate that the elements outlined for routine 300 may be implemented by one or many computing devices/components that are associated with the system 100. For example, the routine 300 can be implemented by any one, or a combination, of the gain controller 112, the calibration controller 114, and the like. Accordingly, routine 300 has been described as being generally performed by the system 100. Furthermore, it will be understood that the system 100 can use routine 300 in the background during normal signal throughput and/or during a calibration time, such as at manufacturing or manufacturing test.

At block 302, the system determines that a data signal (and/or input signal) satisfies a gain range threshold In some embodiments, the data signal is a normalized data signal that corresponds to an input signal. In some embodiments, the system determines that the data signal satisfies the gain range threshold based at least in part on a comparison of the amplitude of the data signal with a gain range threshold. In certain embodiments, the gain range threshold can be the threshold for transitioning from a lower gain range to a higher gain range, or from transitioning from a higher gain range to a lower gain range (also referred to as a hysteresis threshold).

At block 304, the system 100 can adjust the gain of the input signal, the gain of a corresponding data signal and/or the corresponding data signal based at least in part on a calibration value. In some embodiments, the calibration value can be based at least in part on one or more previously determined offset and/or amplification errors of a particular gain range. In certain embodiments, the previously determined measurements of offset and/or amplification errors can be weighted differently. For example, in some embodiments, more recent measurements of the offset and/or amplification errors can have a greater effect on the calibration value than less recent measurements of the offset and/or amplification errors. In some embodiments, the previously determined measurements of offset and/or amplification errors can be weighted the same. For example, in certain embodiments, the previously determined measurements of offset and/or amplification errors can be averaged to determine and/or adjust the calibration value.

In certain embodiments, the gain of the input signal is based at least in part on a gain range within which the amplitude of the data signal (and/or input signal) is located. For example, the system 100 can apply a larger gain (e.g., four) if the amplitude of the data signal (and/or input signal) is located within a lower gain range (e.g., the first gain range 202), and the system 100 can apply a smaller gain (e.g., unity) if the amplitude of the data signal (and/or input signal) resides within a higher gain range (e.g., the third gain range 206). As mentioned previously, the system 100 can apply any gain to the input signal, and can use any number of gain ranges and/or gain range thresholds as desired.

At block 306, the system calibrates for the offset error. In some embodiments, calibrating for the offset error includes identifying the offset error and adjusting the calibration value (or offset calibration value) based at least in part on the identified offset error. In certain embodiments, to identify the offset error, the system 100 compares the amplitude of the data signal in a source gain range with the amplitude of the data signal in the destination gain range. In some embodiments, the system 100 compares the amplitude of the data signal in the destination gain range with an expected value of the data signal in the destination gain range. As will be described in greater detail below with reference to FIGS. 4A and 5, the amplitude can be determined at or near a gain range threshold associated with the source gain range and the destination gain range.

After the offset error is identified, the system 100 can adjust the calibration value to account for the identified offset error. As mentioned previously the calibration value can be based on multiple iterations for identifying the offset error, and in certain embodiments each identified error can be weighted differently. For example, in some embodiments, the most recently identified offset error can be given greater weight in adjusting the calibration value. In some embodiments each identified error can be weighted the same. For example, in certain embodiments, each identified error can be averaged to determine and/or adjust the calibration value.

At block 308, the system calibrates the amplification error. In some embodiments, calibrating the amplification error includes identifying the amplification error and adjusting the calibration value (or amplification calibration value) based at least in part on the identified amplification error. In certain embodiments, to identify the amplification error, the system 100 compares a slope of the data signal in a source (or reference) gain range with the slope of the data signal in the destination gain range.

As will be described in greater detail below with reference to FIGS. 4B and 6, the slopes can be determined in a variety of ways. For example, in some embodiments, the slopes can be determined by comparing the amount of time it takes for the amplitude of the data signal to move from a first threshold to a second threshold in the source gain range to the amount of time it takes for the amplitude of the data signal to move from a third threshold to a fourth threshold in the destination gain range. In certain embodiments, the slopes can be determined by comparing the amount of amplitude change that occurs over a predetermined time period in the source gain range to the amount of amplitude change that occurs over the predetermined time period in the source gain range. In certain cases, the slopes can be determined by taking a derivative of the data signal.

After the amplification error is identified, the system 100 can adjust the calibration value to account for the identified amplification error. As mentioned previously the calibration value can be based on multiple iterations for identifying the amplification error, and in certain embodiments, each identified error can be weighted differently. For example, the most recently identified amplification error can be given greater weight in adjusting the calibration value.

It will be understood the fewer or more blocks can be included in the routine 300. For example, the system can repeatedly calibrate the gain error and the offset error for a particular gain range. In certain embodiments, the system 100 can calibrate the gain error and the offset error for a particular gain range, each time the amplitude of the data signal satisfies the gain range threshold that corresponds to the particular gain range. In some embodiments, the amplitude and offset error calibrations can be done in any order or in parallel. In certain embodiments, the system 100 can calibrate the amplification error and the offset error for all gain ranges of the system. In some embodiments, the system 100 can calibrate all gain ranges of the system 100 except one or more reference gain ranges for amplification error and the offset error. In some cases, the system 100 can calibrate the different gain ranges in parallel.

Figure 4A:
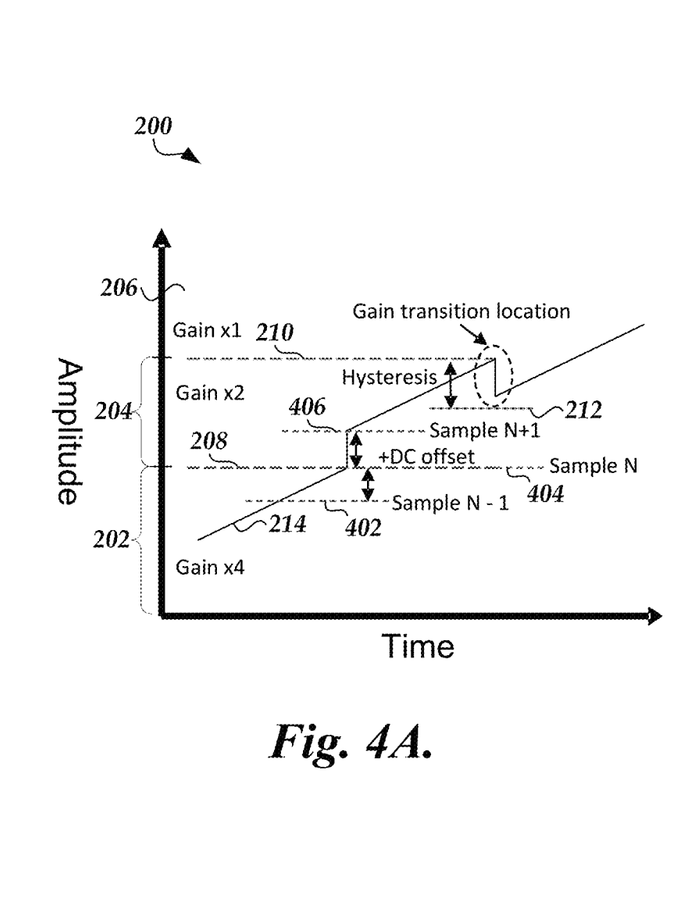
FIG. 4A is a graph illustrative of an embodiment for identifying offset error in a system.

FIG. 4A is an illustration of the graph 200, described in greater detail above with reference to FIG. 2A, and further illustrating an embodiment for identifying offset error in the system 100. As described in greater detail above, the graph 200 includes three gain ranges 202, 204, 206, two gain range thresholds 208, 210, the hysteresis threshold 212, and the line 214 indicative of the amplitude of a normalized data signal. In the illustrated embodiment of FIG. 4A, the graph 200 further illustrates an embodiment for identifying an offset error between a source gain range (e.g., the first gain range 202 or a reference gain range) and the destination gain range (e.g., the second gain range 204) using three sample measurements 402, 404, 406, at time N−1, N, and N+1, respectively. It will be understood that although only three samples are shown, many samples can be taken, as desired. For example, in some embodiments, samples can be taken at regular intervals (e.g., every 10 microseconds, 100 microseconds, etc.).

As mentioned previously, the offset error of the data signal can be determined in a variety of ways, and is not limited to the illustrated embodiment of FIG. 4A. In some embodiments, the system 100 determines fewer or more sample measurements, as desired. For example, the system 100 can determine the first and third sample measurements 402, 406 and omit the second sample measurement 404. In certain embodiments, the system 100 can determine the second and third sample measurements 404, 406 and omit the first sample measurement 402.

In some embodiments, the system 100 can determine the offset error by comparing the first sample measurement 402 with the third sample measurement 406 (e.g., the difference between the first sample measurement 402 and the third sample measurement 406), by comparing the second sample measurement 404 with the third sample measurement 406 (e.g., the difference between the second sample measurement 404 and the third sample measurement 406), and/or by comparing the third sample measurement 406 with an expected value.

In certain embodiments, the system 100 can determine a slope of the data signal in the first gain range 202, and determine the expected value of the third sample measurement 406 by calculating a value of the data signal at time N+1 with the assumption that the slope of the data signal remains constant across the first gain range 202 and the second gain range 204. The determined expected value can be compared with the third sample measurement 406, and the difference can be identified as the offset error.

As implied by the time N−1, the first sample measurement 402 can be based on the value of the data signal prior to time N (the time at which the gain range threshold 208 is satisfied). Similarly, the third sample measurement 406 can be based on the value of the data signal at time N+1 (i.e., after time N).

In some embodiments, the first sample measurement 402 can be based on the value of the data signal just prior to the data signal satisfying the gain range threshold 208. For example, the first sample measurement 402 can be based on the value of the data signal milliseconds or less (e.g., microseconds) prior to the data signal satisfying the gain range threshold 208. Similarly, in certain embodiments, the third sample measurement 406 can be based on the value of the data signal just after the data signal satisfies the gain range threshold 208. For example, the third sample measurement 406 can be based on the value of the data signal milliseconds or less after the data signal satisfies the gain range threshold 208. Although described above as the data signal, it will be understood that in some embodiments, the data signal used can be the digital data signal. In certain embodiments, the data signal can be a normalized data signal, etc. Any combination of the above-described embodiments can be used as desired.

As described in greater detail above, once the offset error is identified for a particular gain range, the system 100 can compensate for the error by adjusting one or more calibration values for the particular gain range as desired.

Figure 4B:
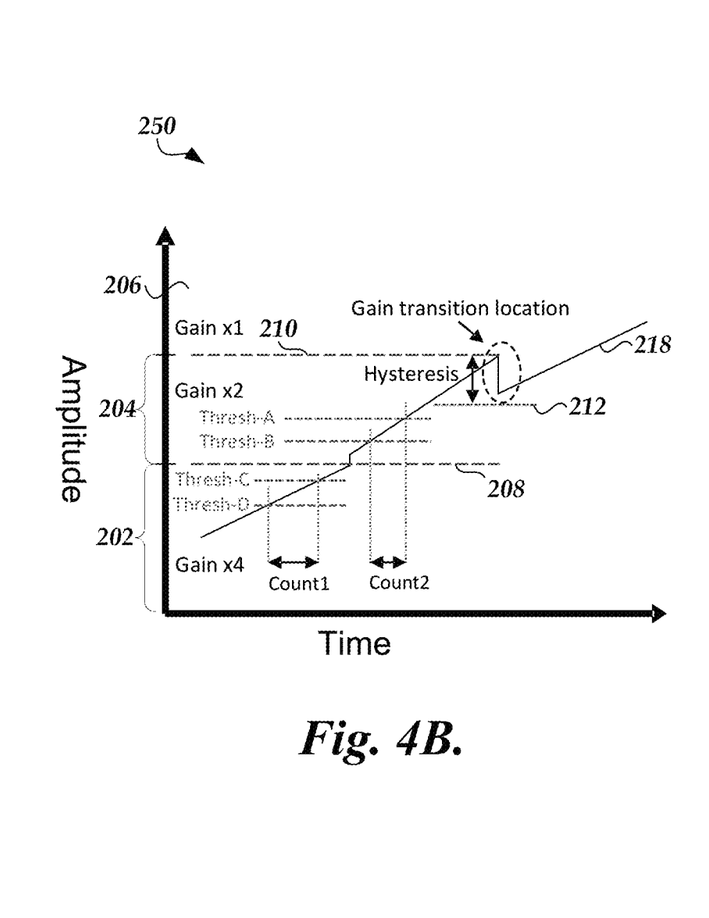
FIG. 4B is a graph illustrative of an embodiment for identifying gain error in a system.

FIG. 4B is a graph illustrative of an embodiment for correcting amplification error in a system. As described in greater detail above, the graph 250 includes three gain ranges 202, 204, 206, two gain range thresholds 208, 210, the hysteresis threshold 212, and the line 218 indicative of the amplitude of a normalized data signal. In the illustrated embodiment of FIG. 4B, the graph 250 further illustrates an embodiment for determining a first slope of the line 218 prior to the normalized data signal satisfying the gain range threshold 208 and determining a second slope of the line 218 after the normalized data signal satisfies the gain range threshold 208. As mentioned previously, the slope of the line 218 (e.g., the slope of the data signal) can be determined in a variety of ways, and is not limited to the illustrated embodiment of FIG. 4B.

The four slope thresholds A, B, C, D and two counters Count1, Count2 illustrated in FIG. 4B can be used in some embodiments to determine the slope (or an indication of the slope) of the line 218 prior to the normalized data signal satisfying the gain range threshold 208 and determining the slope (or an indication of the slope) of the line 218 after the normalized data signal satisfies the gain range threshold 208. In some embodiments, the slope thresholds A and B can be located in the destination gain range (e.g., second gain range 204) and the slope thresholds C and D can be located in the source gain range (e.g., first gain range 202). In certain embodiments the slope threshold A>B, the slope threshold B>C, and the slope threshold C>D.

In some embodiments, once the normalized data signal satisfies the slope threshold D, the counter Count1 can track the amount of time it takes for the normalized data signal to satisfy the slope threshold C. The amount of time recorded by the counter Count1 can be indicative of the slope of the normalized data signal between the slope threshold C and the slope threshold D and/or the slope of the normalized data signal in the source gain range (e.g., the first gain range 202 or a reference gain range).

Similarly, after the normalized data signal satisfies the gain range threshold 208 and the slope threshold B, the counter Count2 can track the amount of time it takes for the normalized data signal to satisfy the slope threshold A. The amount of time recorded by the counter Count1 can be indicative of the slope of the normalized data signal between the slope threshold A and the slope threshold B and/or the slope of the normalized data signal in the destination gain range (e.g., the second gain range 204). The time recorded by the counters Count1, Count2 can be compared and the difference can be identified as the amplification error.

Although the slope thresholds A, B, C, D are illustrated for the first gain range 202 and the second gain range 204, it will be understood that similar slope thresholds can be used in each gain range. Furthermore, each gain range can have multiple sets of slope thresholds. For example, in some embodiments, the second gain range 204 can have a set of slope thresholds at or near the gain range threshold 208 and a second set of slope thresholds at or near the gain range threshold 210. In certain embodiments, the lowest gain range (e.g., first gain range 202) and the highest gain range (e.g., third gain range 206) can each have a single set of slope thresholds, and the gain ranges between the lowest gain range and the highest gain range (e.g., second gain range 204) can each have two sets of slope thresholds, one set at or near a lower gain range threshold (e.g., first gain range threshold 208) and a second set at or near a higher gain range threshold (e.g., second gain range threshold 210). Furthermore, in some embodiments, the system 100 can use a predetermined slope of the data signal in the reference gain range as the slope for the source gain range.

It will be understood that fewer or more slope thresholds for each gain range can be used as desired. For example, in some embodiments, the system can use a first slope threshold in the first gain range 202, the gain range threshold 208 as a second slope threshold, and a third slope threshold in the second gain range 204. The slope (or count) between the first and second slope thresholds can be compared with the slope (or count) between the second and third slope thresholds to determine the amplification error.

In some embodiments, the amplitude difference between the slope thresholds in a set can be relatively small (e.g., one or more millivolts). As such, the count determined by the counters Count1, Count2, can avoid taking into account the curvature of a data signal in determining the slope. In certain embodiments, the slope thresholds can be relatively close to a corresponding gain range threshold (e.g., ±1%, ±0.1%, or less). For example, if the gain range threshold is 10, the slope thresholds that are closest to the gain range threshold can be 10±0.1, or smaller. Furthermore, in some embodiments, the set of thresholds in the source gain range and the set of thresholds in the destination gain range can be equidistant to the gain range threshold. In addition, in certain embodiments, the amplitude difference between the slope thresholds in the source gain range (e.g., C and D) and the source thresholds in the destination gain range (A and B) can be equal. Any combination of the above-referenced embodiments can be used as desired.

In some embodiments, the system can use one or more counters (e.g., Count1 and/or Count2) to determine the slope in the source gain range and the destination gain range. For example, the counter Count1 can count for a predetermined time period in the source gain range and a predetermined time period in the destination gain range. The system can compare the change in amplitude over the predetermined time period in the source gain range with the change in amplitude over the predetermined time period in the destination gain range. In some embodiments, the difference between the change in amplitude in the source gain range and the change in amplitude in the destination gain range can be identified as the amplification error.

The length of the predetermined time period can be any length as desired. In some embodiments, the length can be 10 microseconds, 100 microseconds, one or more milliseconds, etc. In some embodiments, the predetermined time period can be based at least in part on the frequency of the data signal. For example, in some cases, a shorter predetermined time period can be used for data signals with a higher frequency and a longer predetermined time period can be used for data signals with a lower frequency.

In certain embodiments, the counter Count1 can begin counting in the source gain range just prior to the data signal satisfying the grain range threshold. For example, the counter Count1 can begin counting milliseconds or less (e.g., microseconds) prior to the time (or expected time) at which the data signal (and/or input signal) satisfies the gain range threshold 208. In some embodiments, the counter Count1 can begin counting in the destination gain range just after the data signal (and/or input signal) satisfies the grain range threshold. For example, the counter Count1 can begin counting milliseconds or less after the data signal (and/or input signal) satisfies the gain range threshold 208, as desired.

As described in greater detail above, after the amplification error is identified for a particular gain range, the system 100 can compensate for the error by adjusting one or more calibration values for the particular gain range as desired. Furthermore, in some embodiments, the system 100 can adjust the one or more calibration values based at least in part on the observed offset error and/or amplification error.

Figure 5:
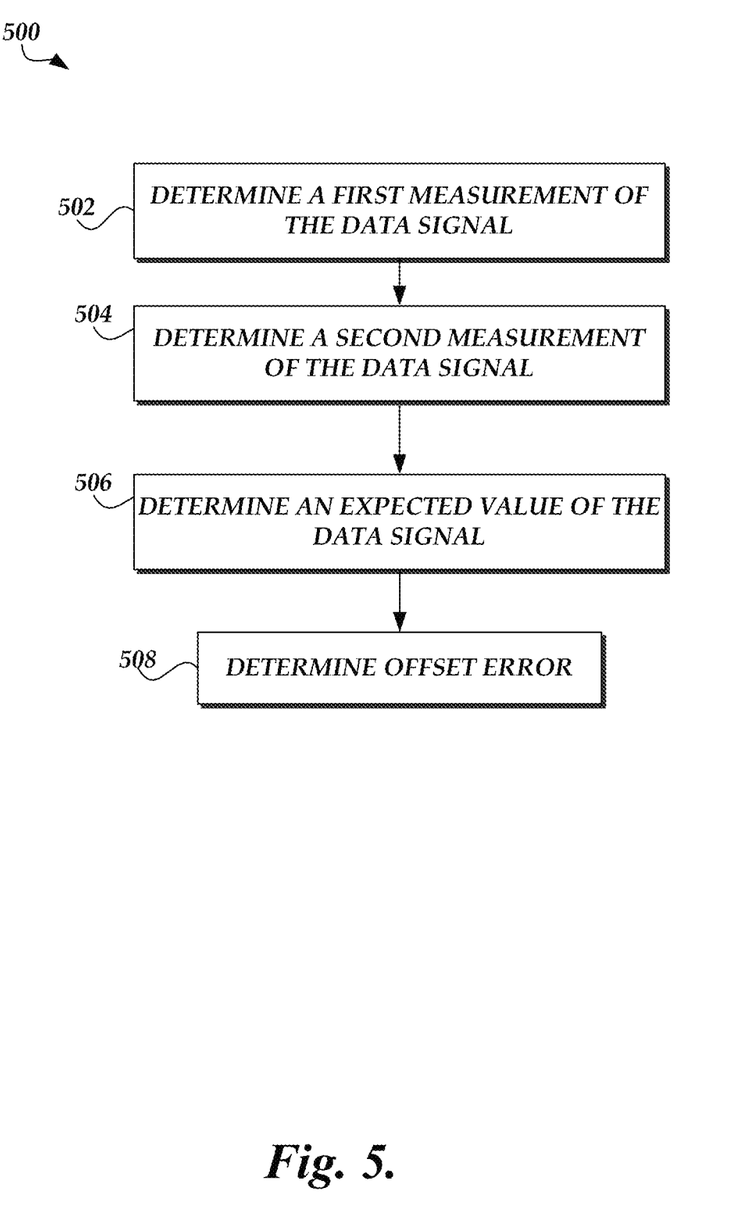
FIG. 5 is a flow diagram illustrative of an embodiment for calibrating amplification error in a system.

FIG. 5 is a flow diagram illustrative of an embodiment of a routine 500 for calibrating the system 100 for offset error. One skilled in the relevant art will appreciate that the elements outlined for routine 500 may be implemented by one or many computing devices/components that are associated with the system 100. For example, the routine 500 can be implemented by any one, or a combination, of the gain controller 112, the calibration controller 114, and the like. Accordingly, routine 500 has been described as being generally performed by the system 100. Furthermore, it will be understood that the system 100 can use routine 500 during normal signal throughput and/or during a calibration time, such as at manufacturing.

At block 502, the system 100 determines a first measurement of the data signal. In some embodiments, the data signal is a normalized data signal and/or corresponds to an input signal. In certain embodiments, the first measurement is determined as an amplitude of the data signal at a first time that is prior to a time at which the data signal (and/or input signal) satisfies a gain range threshold (e.g., when the data signal (and/or input signal) is within a source gain range). In some embodiments, the system 100 determines the first measurement when the amplitude of the data signal (and/or input signal) satisfies a threshold value that is less than the gain range threshold (or greater than a hysteresis threshold).

At block 504, the system 100 determines a second measurement of the data signal. In some embodiments, the second measurement is determined at a second time that is after the time at which the amplitude of the data signal (and/or input signal) satisfies the gain range threshold (e.g., when the data signal (and/or input signal) is within a destination gain range).

In some embodiments, the system 100 determines the second measurement as an amplitude of the data signal when the data signal (and/or input signal) satisfies a threshold value that is greater than the gain range threshold (or less than a hysteresis threshold).

At block 506, the system 100 determines an expected value of the data signal. In some embodiments, the expected value is based at least in part on the first measurement. In certain embodiments, the expected value is based at least in part on a slope of the data signal (and/or input signal) prior to satisfying the gain range threshold (e.g., when the amplitude of the data signal is in the source gain range). Using the first measurement and the slope of the data signal prior to satisfying the gain range threshold, the system 100 can determine the expected value of the data signal at the second time.

At block 508, the system 100 determines the offset error. In some embodiments, the system 100 determines the offset error based at least in part on the first measurement and the second measurement. In certain embodiments, the system 100 determines the offset error based at least in part on the second measurement and the expected value. For example, in some embodiments, the system 100 can determine the offset error to be the difference between the expected value and the second measurement. In certain embodiments, the expected value can be determined based at least in part on the first measurement and a slope of the data signal in the source gain range.

It will be understood that fewer, more, or different blocks can be used in the routine 500 without departing from the spirit of the description. Furthermore, the order of the blocks can be different, as well. For example, in some embodiments, the system 100 determines the expected value prior to determining the second measurement. In certain embodiments, the system 100 determines the second measurement and the expected value in parallel.

Furthermore, in some embodiments, prior to determining the second measurement, the system 100 can determine that the data signal satisfies a gain range threshold (and/or enters a destination gain range) and change the gain factor used to amplify the input signal, based at least in part on the determination that the data signal satisfies the gain range threshold. In such embodiments, the second measurement can be determined after the input signal has been amplified by the new gain factor.

In addition, in some cases, the input signal can be altered based at least in part on a calibration value associated with the destination gain range, described in greater detail above. In some embodiments, the system 100 adjusts the calibration value associated with the destination gain range, based at least in part on the determined offset error.

In certain embodiments, following additional iterations (e.g., when the data signal (and/or input signal) satisfies the gain range threshold again), the system 100 can alter the input signal based at least in part on the adjusted calibration value. In some embodiments, more recent offset error(s) can have a larger effect on the calibration value than less recently determined offset errors. In some embodiments, the calibration is triggered based at least in part on the data signal satisfying the gain range threshold. In certain embodiments, the system 100 calibrates the offset error for all gain ranges. In some embodiments, the system 100 calibrates all gain ranges for offset error except one or more reference gain ranges. In some cases, the system 100 can calibrate the different gain ranges in parallel.

Figure 6:
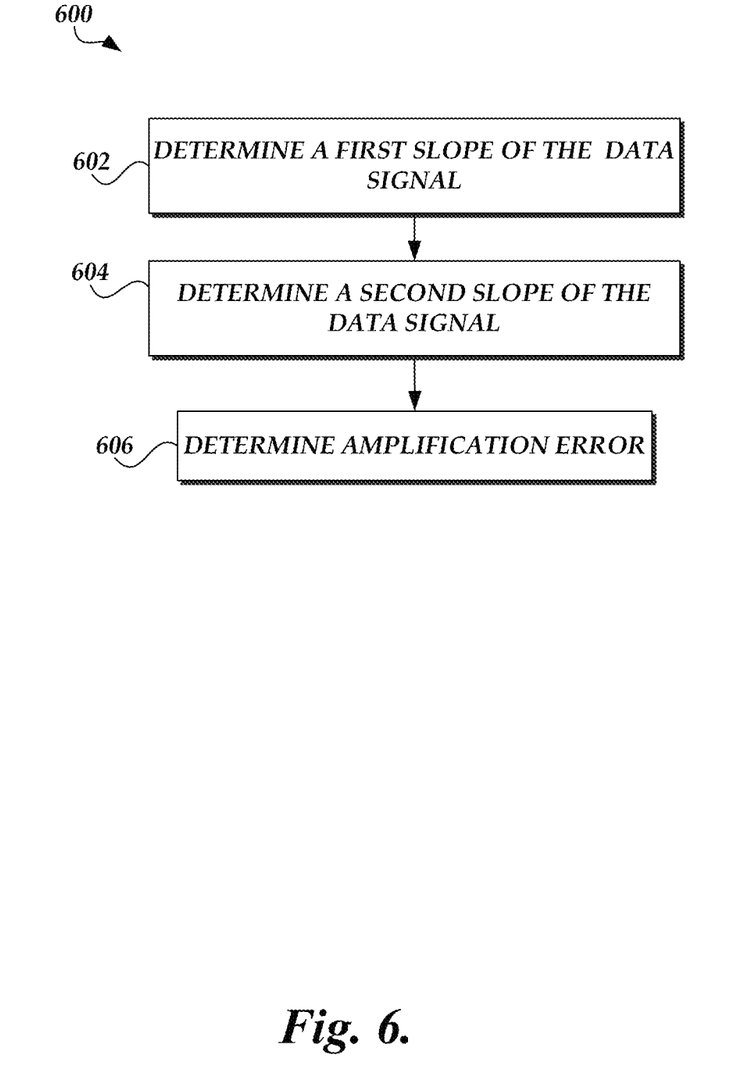
FIG. 6 is a flow diagram illustrative of an embodiment for calibrating offset error in a system.

FIG. 6 is a flow diagram illustrative of an embodiment of a routine 600 for calibrating the system 100 for amplification error. One skilled in the relevant art will appreciate that the elements outlined for routine 600 may be implemented by one or many computing devices/components that are associated with the system 100. For example, the routine 600 can be implemented by any one, or a combination, of the gain controller 112, the calibration controller 114, and the like. Accordingly, routine 600 has been described as being generally performed by the system 100. Furthermore, it will be understood that the system 100 can use routine 600 during normal signal throughput and/or during a calibration time, such as at manufacturing.

At block 602, the system 100 determines a first slope of the data signal. In some embodiments, the data signal is a normalized data signal and/or corresponds to an input signal. In certain embodiments, the first slope is determined based at least in part on the data signal at a first time that is prior to a time at which the amplitude of the data signal satisfies a gain range threshold (e.g., when the data signal is within a source gain range). In some embodiments, the system 100 determines the slope of the data signal based at least in part on a derivative of the data signal in the source gain range. In certain embodiments, the system determines the first slope of the data signal by identifying a predefined slope of the data signal in the reference gain range. In some instances, a change in amplitude of the data signal over a predetermined time period in the source gain range can be used to determine the first slope.

In some embodiments, the system 100 uses slope thresholds and a counter to determine the first slope. For example, as described earlier, the counter can track the time it takes for the data signal to satisfy a second slope threshold after it has satisfied a first slope threshold. The tracked time can be used by the system 100 as the slope of the data signal prior to the data signal satisfying the gain range threshold (e.g., the slope of the data signal when it is within the source gain range). As described previously, the slope thresholds, in some embodiments, can be close together, and/or the slope thresholds can be close to the gain range threshold.

At block 604, the system 100 determines a second slope of the amplitude of the data signal. In some embodiments, the system 100 determines the slope of the data signal based at least in part on a derivative of the data signal in the destination gain range. In certain embodiments, a change in amplitude of the data signal over a predetermined time period in the destination gain range can be used to determine the second slope. In some embodiments, the system 100 uses slope thresholds and a counter to determine the second slope. For example, as described earlier, the counter can track the time it takes for the data signal to satisfy a fourth slope threshold after it has satisfied a third slope threshold. The tracked time can be used by the system 100 as an indicator of the slope of the data signal after the data signal satisfies the gain range threshold (e.g., the slope of the data signal when it is within the destination gain range). As described previously, the slope thresholds, in some embodiments, can be close together. In certain embodiments, the slope thresholds can be close to the gain range threshold.

At block 606, the system 100 determines an amplification error based at least in part on the difference between the first slope and the second slope. In some embodiments, the system 100 determines that the difference between the first slope and the second slope is the amplification error.

It will be understood that fewer, more, or different blocks can be used in the routine 600 without departing from the spirit of the description. Furthermore, the order of the blocks can be different, as well. For example, in some embodiments, prior to determining the second slope, the system 100 can determine that the data signal satisfies the gain range threshold, and change the gain factor used to amplify the input signal, based at least in part on the determination that the data signal satisfies the gain range threshold. In such embodiments, the second slope can be determined after the input signal has been amplified by the new gain factor.

In addition, in some cases, the input signal can be altered based at least in part on a calibration value associated with the destination gain range, described in greater detail above. In some embodiments, the system 100 adjusts the calibration value associated with the destination gain range, based at least in part on the determined amplification error.

In certain embodiments, following additional iterations (e.g., when the data signal satisfies the gain range threshold again), the system 100 can alter the input signal based at least in part on the adjusted calibration value. In some embodiments, more recently determined amplification error(s) can have a larger effect on the calibration value than less recently determined amplification error(s). In some embodiments, the calibration is triggered based at least in part on the data signal satisfying the gain range threshold. In certain embodiments, the system 100 calibrates all gain ranges for amplification error. In some embodiments, the system 100 calibrates all gain ranges for amplification error except one or more reference gain ranges. In some cases, the system 100 can calibrate the different gain ranges in parallel.

Furthermore, in some embodiments, the routines 500 and 600 can be combined such that a calibration value is determined or adjusted based at least in part on a determined offset error and/or a determined amplification error.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially.

The various illustrative logical blocks, modules, controllers, and circuits described in connection with the implementations disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

Furthermore, the systems, controllers, and modules described herein may comprise software, firmware, hardware, or any combination(s) of software, firmware, or hardware suitable for the purposes described herein. Software and other modules may reside on servers, workstations, personal computers, computerized tablets, PDAs, and other devices suitable for the purposes described herein. Software and other modules may be accessible via local memory, via a network, via a browser, or via other means suitable for the purposes described herein. Data structures described herein may comprise computer files, variables, programming arrays, programming structures, or any electronic information storage schemes or methods, or any combinations thereof, suitable for the purposes described herein.

Further, the processing of the various components of the illustrated systems can be distributed across multiple machines, networks, and other computing resources. In addition, two or more components of a system can be combined into fewer components. Various components of the illustrated systems can be implemented in one or more virtual machines, rather than in dedicated computer hardware systems. Moreover, in some embodiments the connections between the components shown represent possible paths of data flow, rather than actual connections between hardware. While some examples of possible connections are shown, any of the subset of the components shown can communicate with any other subset of components in various implementations.

Embodiments are also described above with reference to flow chart illustrations and/or block diagrams of methods, apparatus (systems) and computer program products. Each block of the flow chart illustrations and/or block diagrams, and combinations of blocks in the flow chart illustrations and/or block diagrams, can be embodied directly in hardware, computer program instructions executed by a processor, or in a combination of the two. Such instructions may be provided to a processor of a general purpose computer, special purpose computer, or other programmable data processing apparatus (e.g., FPGA, PLD, ASIC, etc.) to produce a machine, such that the instructions, which execute via the processor of the computer or other programmable data processing apparatus, create means for implementing the acts specified in the flow chart and/or block diagram block or blocks.

These computer program instructions may also be stored in a computer-readable memory that can direct a computer or other programmable data processing apparatus to operate in a particular manner, such that the instructions stored in the computer-readable memory produce an article of manufacture including instruction means which implement the acts specified in the flow chart and/or block diagram block or blocks. The computer program instructions may also be loaded onto a computer or other programmable data processing apparatus to cause a series of operations to be performed on the computer or other programmable apparatus to produce a computer implemented process such that the instructions which execute on the computer or other programmable apparatus provide steps for implementing the acts specified in the flow chart and/or block diagram block or blocks.

While certain embodiments have been described, these embodiments have been presented by way of example only, and are not intended to limit the scope of the disclosure. Indeed, the novel methods and systems described herein may be embodied in a variety of other forms; furthermore, various omissions, substitutions and changes in the form of the described methods and systems may be made without departing from the spirit of the disclosure. The accompanying claims and their equivalents are intended to cover such forms or modifications as would fall within the scope and spirit of the disclosure.

Although this disclosure has been described in terms of certain embodiments, other embodiments that are apparent to those of ordinary skill in the art, including embodiments that do not provide all of the features and advantages set forth herein, are also within the scope of the disclosure. Moreover, the various embodiments described above can be combined to provide further embodiments. In addition, certain features shown in the context of one embodiment can be incorporated into other embodiments as well. Accordingly, the scope of the disclosure is defined only by reference to the appended claims.

What is claimed is:

1. A method for calibrating a gain stage of a gain circuit of a data acquisition system, the method comprising:
    amplifying an input signal by a first gain amount of a plurality of gain amounts based at least in part on a determination that an amplitude of a data signal is within a first gain range of a plurality of gain ranges;
    determining the amplitude of the data signal enters a second gain range of the plurality of gain ranges;
    amplifying the input signal by a second gain amount of the plurality of gain amounts that is different from the first gain amount based at least in part on said determining the amplitude of the data signal enters the second gain range and at least one of an amplification calibration value or an offset calibration value; and
    adjusting at least one of the amplification calibration value based at least on a detected amplification error between the first gain and the second gain or the offset calibration value based at least on a detected offset error between the first gain and the second gain.

2. The method of claim 1, wherein said adjusting comprises adjusting the amplification calibration value and the offset calibration value.

3. A method for calibrating a gain stage of a gain circuit of a data acquisition system, the method comprising:
    determining that an amplitude of a data signal moves from a first gain range to a second gain range;
    amplifying an input signal by a gain amount associated with the second gain range based at least in part on a calibration value associated with the second gain range and on said determining the amplitude of the data signal moves from the first gain range to the second gain range; and
    adjusting the calibration value based at least in part on a determined error.

4. The method of claim 3, wherein the calibration value comprises an amplification calibration value and the determined error comprises a determined amplification error.

5. The method of claim 4, further comprising:
    determining a first slope of an amplitude of the data signal, wherein the first slope is based at least in part on the amplitude of the data signal at a time prior to the amplitude of the data signal moving from the first gain range to the second gain range;
    determining a second slope of the amplitude of the data signal, wherein the second slope is based at least in part on the amplitude of the data signal at a time following the amplitude of the data signal moving from the first gain range to the second gain range; and
    determining the determined amplification error based at least in part on a difference between the first slope and the second slope.

6. The method of claim 4, wherein the amplification calibration value is based at least in part on one or more previously determined amplification errors.

7. The method of claim 6, wherein the amplification calibration value is based at least in part on an average of the one or more previously determined amplification errors.

8. The method of claim 6, wherein the one or more previously determined amplification errors are weighted based at least in part on an order in which the one or more previously determined amplification errors were determined.

9. The method of claim 5, wherein determining the first slope comprises determining an amount of time that has elapsed between the amplitude of the data signal satisfying a first slope threshold and the amplitude of the data signal satisfying a second slope threshold, and wherein determining the second slope comprises determining an amount of time that has elapsed between the amplitude of the data signal satisfying a third slope threshold and the amplitude of the data signal satisfying a fourth slope threshold.

10. The method of claim 5, wherein determining the first slope comprises determining a change in amplitude during a predetermined time period that is prior to the amplitude of the data signal moving from the first gain range to the second gain range and determining the second slope comprises determining a change in amplitude during the predetermined time period following the amplitude of the data signal moving from the first gain range to the second gain range.

11. The method of claim 3, wherein the calibration value comprises an offset calibration value and the determined error comprises a determined offset error.

12. The method of claim 11, further comprising:
    determining a first amplitude measurement of the data signal at a first time, wherein the first time is prior to the amplitude of the data signal moving from the first gain range to the second gain range;
    determining a second amplitude measurement of the data signal at a second time, wherein the second time is after the amplitude of the data signal moving from the first gain range to the second gain range;
    determining an expected value of the data signal at the second time based at least in part on the first amplitude measurement; and
    determining the determined offset error based at least in part on a difference between the second amplitude measurement and the expected value.

13. The method of claim 11, wherein the offset calibration value is based at least in part on one or more previously determined offset errors.

14. The method of claim 11, wherein the offset calibration value comprises an average of one or more previously determined offset errors.

15. The method of claim 13, wherein the one or more previously determined offset errors are weighted based at least in part on an order in which the one or more previously determined offset errors were determined.

16. A device for calibrating a gain stage of a gain circuit of a data acquisition system, the device comprising:
    a gain circuit configured to
        amplify an input signal by a first gain factor based at least in part on a determination that an amplitude of the input signal is within a first gain range associated with the first gain factor,
        amplify the input signal by a second gain factor based at least in part on a calibration value and a determination that the amplitude of the input signal is within a second gain range associated with the second gain factor; and
    a gain controller configured to adjust the calibration value based at least in part on a determined error between the first gain factor and the second gain factor.

17. The device of claim 16, wherein the determined error comprises at least one of an amplification error or an offset error, and wherein the gain controller is further configured to:
    determine at least one of the offset error or the amplification error, and
    adjust the calibration value based at least in part on the determined at least one of the offset error or the amplification error.

18. The device of claim 17, wherein the gain controller is configured to adjust the calibration value based at least in part on the amplification error, and wherein the gain controller is further configured to:
    determine a first slope of the input signal, wherein the first slope is based at least in part on an amplitude of the input signal prior to the input signal satisfying a gain range threshold;
    determine a second slope of the input signal, wherein the second slope is based at least in part on the amplitude of the input signal following the input signal satisfying the gain range threshold; and
    determine the amplification error based at least in part on a difference between the first slope and the second slope.

19. The device of claim 17, wherein the calibration value is based at least in part on one or more previously determined amplification errors.

20. The device of claim 19, wherein the one or more previously determined amplification errors are weighted based at least in part on an order in which the gain controller determined the one or more previously determined amplification errors.

21. The device of claim 17, wherein to determine the offset error, the gain controller is configured to:
    determine a first amplitude measurement of the input signal, wherein the first amplitude measurement is based at least in part on an amplitude of the input signal prior to the input signal satisfying a gain range threshold;
    determine a second amplitude measurement of the input signal, wherein the second amplitude measurement is based at least in part on the amplitude of the input signal following the input signal satisfying the gain range threshold;
    determine an expected value of the input signal based at least in part on the first amplitude measurement; and
    determine an offset calibration value based at least in part on a difference between the second amplitude measurement and the expected value.

22. The device of claim 21, wherein the calibration value is based at least in part on one or more previously determined offset errors.

* * * * *